(12) United States Patent
Eno et al.

(10) Patent No.: US 11,373,714 B2
(45) Date of Patent: Jun. 28, 2022

(54) REDUCED PROXIMITY DISTURB MANAGEMENT VIA MEDIA PROVISIONING AND WRITE TRACKING

(71) Applicant: Micron Technology, Inc., Boise, ID (US)

(72) Inventors: Justin Eno, El Dorado Hills, CA (US); Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 700 days.

(21) Appl. No.: 16/108,077

(22) Filed: Aug. 21, 2018

(65) Prior Publication Data

US 2020/0066360 A1 Feb. 27, 2020

(51) Int. Cl.
*G11C 7/00* (2006.01)
*G11C 16/34* (2006.01)
*G11C 16/04* (2006.01)
*G06F 12/02* (2006.01)
*G11C 16/10* (2006.01)

(52) U.S. Cl.
CPC ...... *G11C 16/3427* (2013.01); *G06F 12/0246* (2013.01); *G11C 16/0483* (2013.01); *G11C 16/10* (2013.01); *G11C 16/3495* (2013.01); *G06F 2212/7201* (2013.01)

(58) Field of Classification Search
CPC . G11C 16/0483; G11C 16/10; G11C 16/3427; G11C 16/3495; G06F 12/0246; G06F 12/0607; G06F 2212/1008; G06F 2212/7201; G06F 2212/7202
See application file for complete search history.

(56) References Cited

U.S. PATENT DOCUMENTS

| | | | |
|---|---|---|---|
| 9,711,234 B1 * | 7/2017 | Van Gaasbeck | G11C 16/26 |
| 2012/0297116 A1 * | 11/2012 | Gurgi | G11C 16/3427 711/103 |
| 2017/0102896 A1 * | 4/2017 | D'Abreu | G06F 3/0638 |
| 2019/0348145 A1 * | 11/2019 | Bradshaw | G11C 29/70 |
| 2019/0371416 A1 * | 12/2019 | Kuddannavar | G11C 16/0483 |

* cited by examiner

*Primary Examiner* — Hien N Nguyen
(74) *Attorney, Agent, or Firm* — Nicholson De Vos Webster & Elliott LLP

(57) ABSTRACT

A group of sectors of a memory is provisioned for a logical volume such that an unprovisioned capacity of the memory interleaves at least a subset of the group of sectors to provide proximity disturb isolation. A request to access the memory is received, the request including a logical address within the logical volume. A sector within the group of sectors is identified, the sector corresponding to the logical address, and the requested access is performed in the sector within the group of sectors.

20 Claims, 8 Drawing Sheets

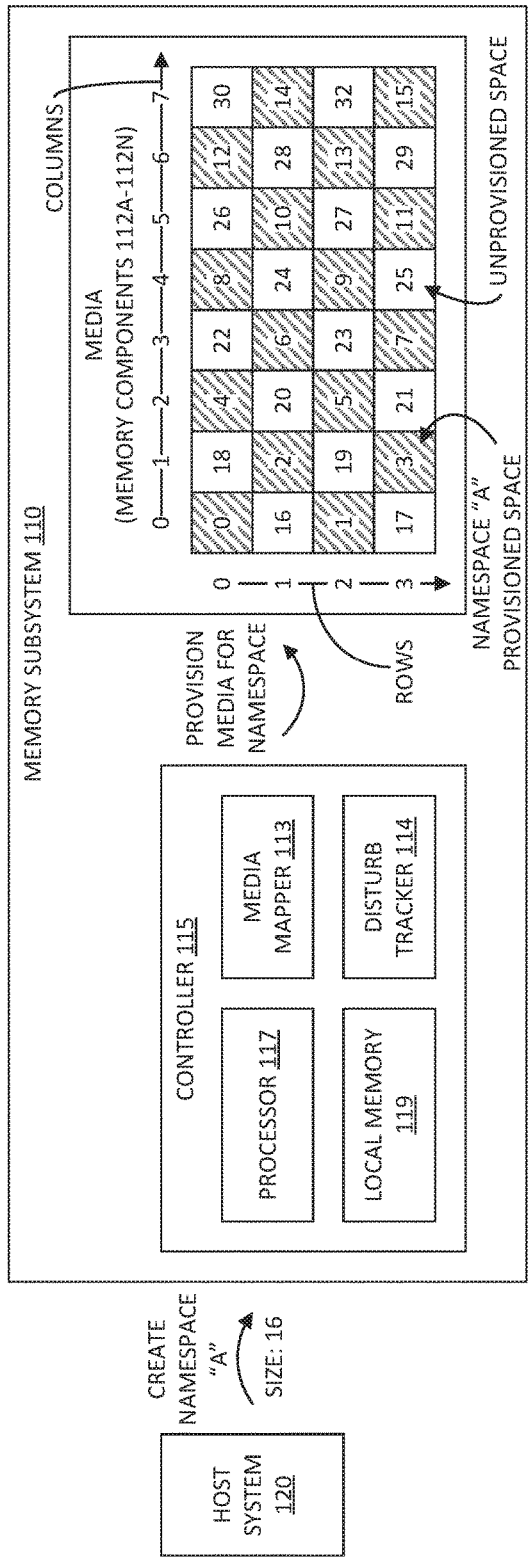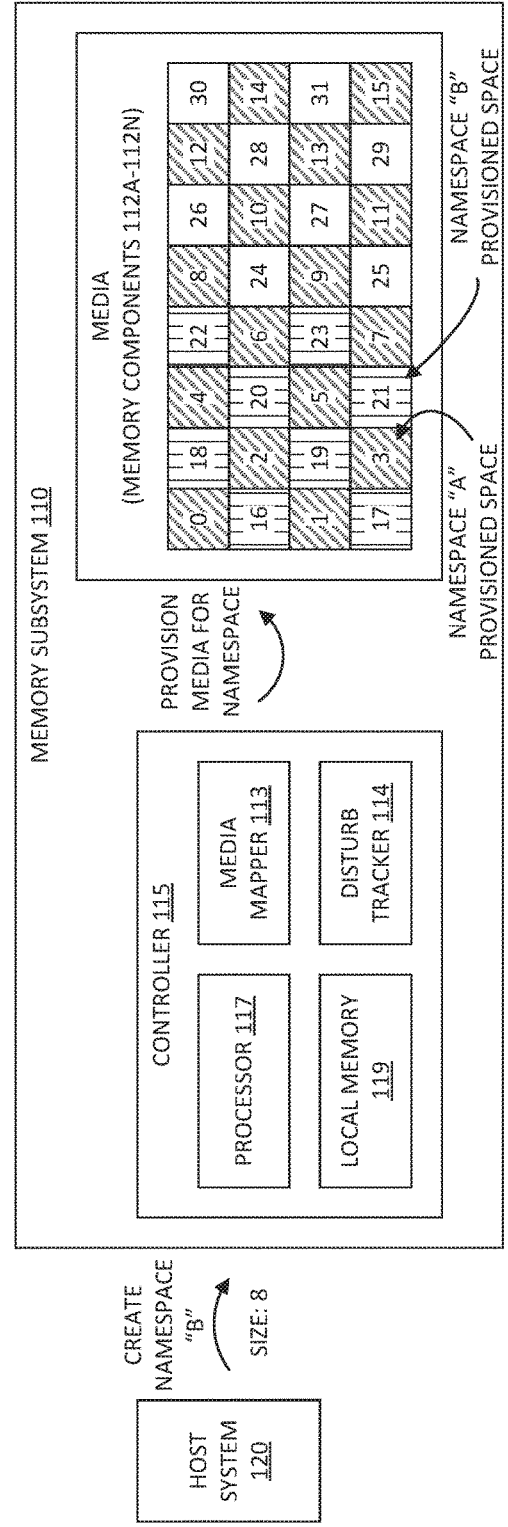

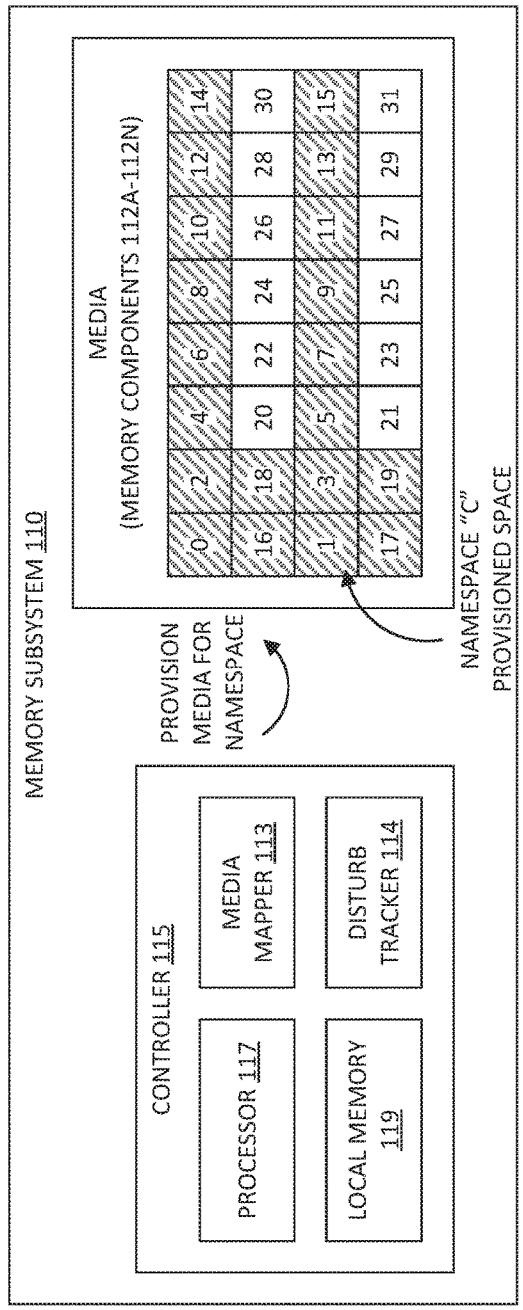
FIGURE 3
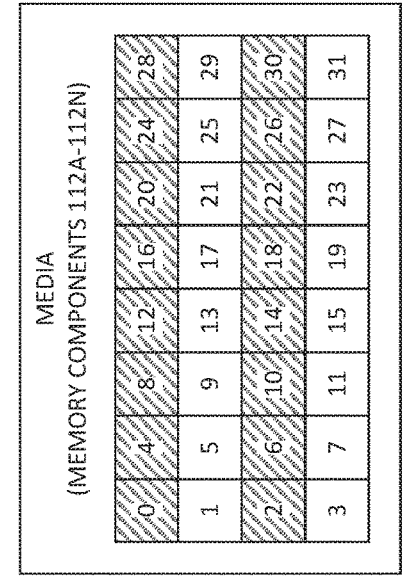
FIGURE 4
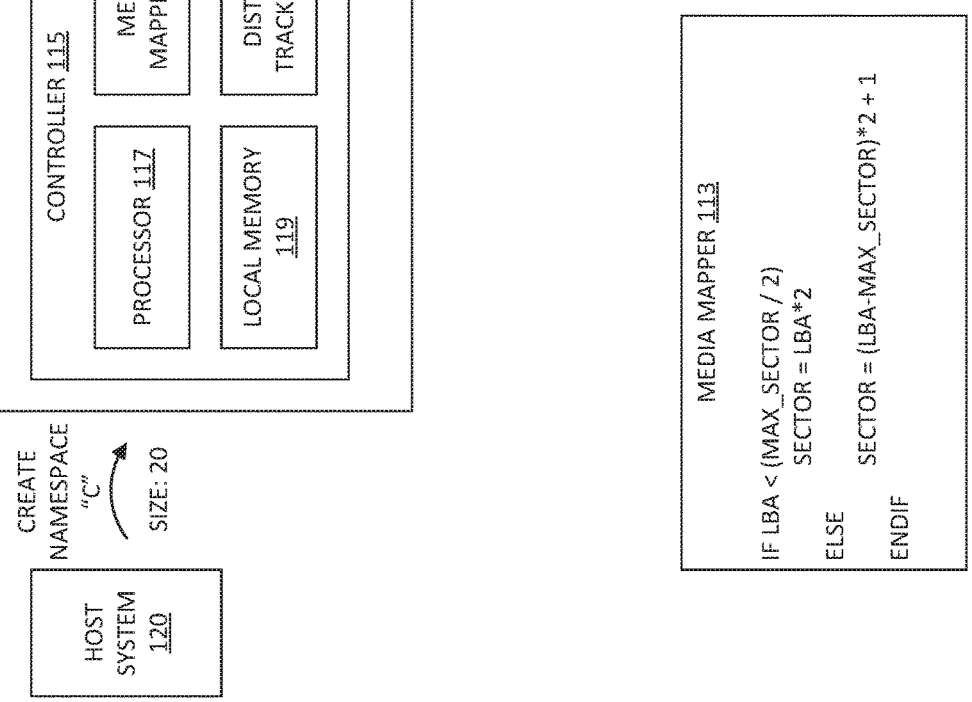

REDUCED PROXIMITY DISTURB MANAGEMENT VIA MEDIA PROVISIONING AND WRITE TRACKING

TECHNICAL FIELD

The present disclosure generally relates to managing proximity disturbance effects and, more specifically, relates to reducing proximity disturb management overhead via one or both of media provisioning and write tracking.

BACKGROUND ART

A memory subsystem can be a storage system, such as a solid-state drive (SSD), including one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 2A-2B illustrate exemplary sparse provisioning of media using a sparse addressing scheme in accordance with some embodiments of the present disclosure.

FIG. 3 illustrates another exemplary sparse provisioning of media using a sparse addressing scheme in accordance with some embodiments of the present disclosure.

FIG. 4 illustrates another exemplary sparse provisioning of media by adjusting a logical to physical address mapping in accordance with some embodiments of the present disclosure.

DETAILED DESCRIPTION

Figure 1:
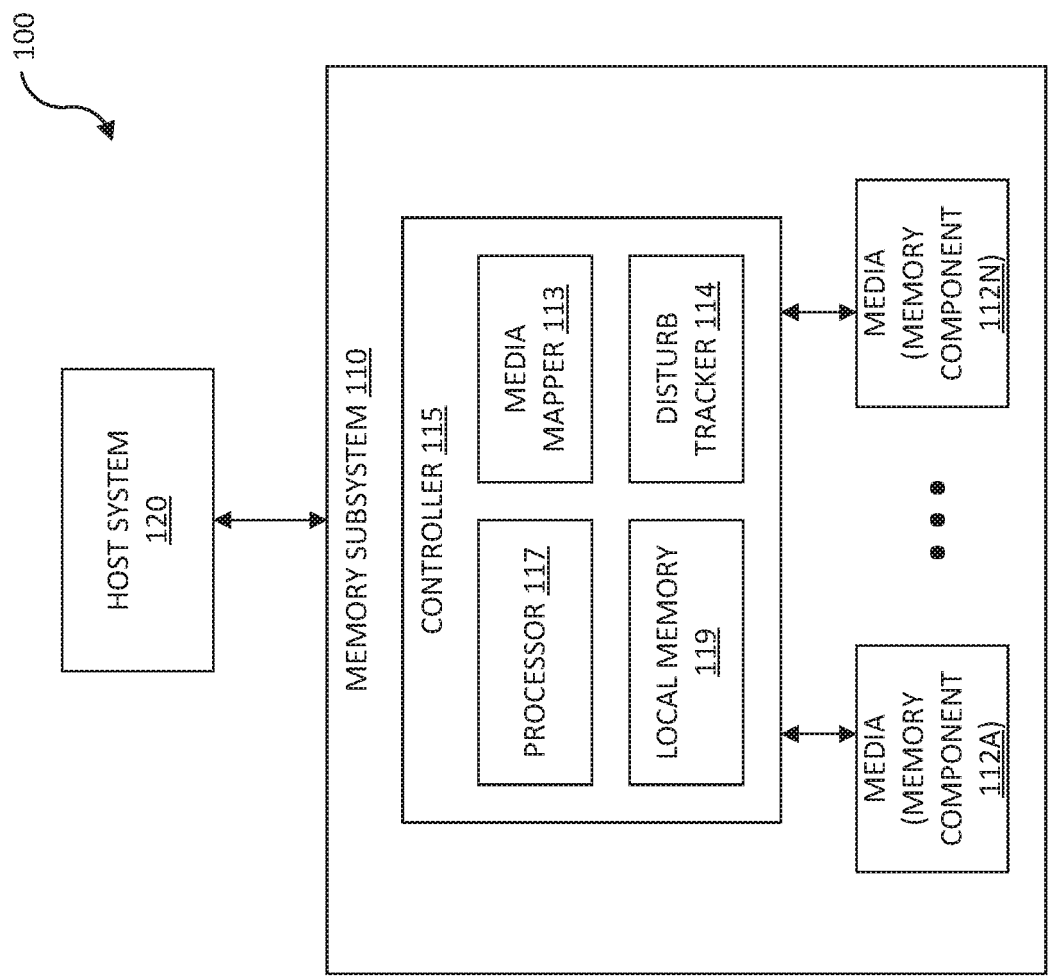
FIG. 1 illustrates an example computing environment that includes a memory subsystem in accordance with some embodiments of the present disclosure.

Aspects of the present disclosure are directed to managing proximity disturb in a memory subsystem. A memory subsystem is also hereinafter referred to as a "memory device."

An example of a memory subsystem is a storage system, such as a solid-state drive (SSD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

As the density of the memory cells that store data to form the memory subsystem increase, proximity disturb can cause an access to one memory cell to disturb the data stored in nearby memory cells due to the reduced distance (and therefore isolation) between memory cells. Failure to manage proximity disturb can cause repeated accesses to one cell (an aggressor) to change the value of data stored in another cell (a victim), such as from a '1' to a '0' or vice versa. This change can lead to data loss. One management technique involves tracking the number of times a victim has been aggressed using a counter. When the counter reaches a certain threshold, the memory subsystem re-writes the data stored in the victim to "refresh" its level and reset the accumulated disturbance. Although effective, such a technique is not without cost as it requires both additional memory (e.g., to store the counters for potential victims) and computational overhead (e.g., to identify victims of an aggressor, to access and increment counters; to re-write the data when a counter reaches the threshold). These costs impose a quality of service penalty on the performance of the memory subsystem as they can impede or interrupt host system transactions. Accordingly, avoiding proximity disturb management would reduce these costs and increase the overall memory subsystem performance.

Aspects of the present disclosure address the above and other challenges in at least two ways. First, the present disclosure describes techniques to avoid disturbance management where less than the total capacity of the memory subsystem has been provisioned for use. From the perspective of the host system, the memory subsystem allows the host to create logical volumes for data storage operations without detailed knowledge of the underlying media architecture or management. Logical volumes may also be referred to as namespaces, logical disks, or logical units, depending on the host to memory subsystem interface, and may be of arbitrary size (so long as they are smaller than the total capacity offered by the memory subsystem). If, for example, a memory subsystem has 500 gigabytes (GB) of total capacity, a host system may create multiple logical volumes whose total size is less than 500 GB (e.g., one volume of 100 GB and another of 50 GB). The memory subsystem provisions some portion of the media to each logical volume. When the memory subsystem provisions less than the entirety of the media, the memory subsystem can leverage the unprovisioned space to eliminate or reduce the number of proximity disturb relationships. In particular, the memory subsystem can employ a sparse addressing scheme or sparse logical to physical address mapping to interleave the provisioned capacity with the remaining unprovisioned capacity, thereby increasing the distance (and thus isolation) between memory cells within the logical volume(s) that store data. As a result, the memory subsystem can eliminate proximity disturb management for provisioning levels of up to 50% of the memory subsystem's total capacity and incrementally increase the overhead as the provisioning increases from 50% to 100%.

Second, and separately or in conjunction with leveraging unprovisioned capacity to reduce the number of proximity disturb relationships, the memory subsystem can introduce a write tracking scheme to avoid preserving the contents of memory cells that are part of provisioned capacity but do not contain data that requires preservation. As mentioned above, one proximity disturb management scheme uses a counter to track the cumulative level of disturbance of a memory cell. Once the level of the counter exceeds a threshold, the proximity disturb management scheme remediates the accumulated disturbance by re-writing the data to the memory cell to reset the disturb level. This re-write disturbs proximate victims, reducing the number of additional aggressions those victims may tolerate, and can even cause a cascade of re-writes as subsequent re-writes cause victim cells to exceed the disturb threshold. In this manner, proximity disturb remediation can increase the frequency at which remediation occurs, occupy the media with non-host-system operations, and even reduce the usable life of the media. To avoid unnecessary re-writes for data preservation, the memory subsystem encodes within the counter value an indication that the memory cell does not include valid, written, or otherwise to-be-preserved data. Thus, provisioned but empty locations do not trigger remediation, thereby reducing proximity management overhead.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address (LBA) and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

A host system 120 can issue a command to create a logical volume of host-specified size. In response to receiving the command, the controller 115 provisions a portion of the media to provide the host with the requested amount of space for data storage operations. The host system 120 can address blocks within the logical volume with logical block addresses (LBAs). Each LBA references a specific amount of data, such as 512 or 4,096 bytes. The memory subsystem 110 translates the LBA to the corresponding physical addresses in the media that store the data, which are referred to herein as a sector. The total amount of space identified by a sector may be larger than the size of the LBA to allow the memory subsystem 110 to store additional overhead data associated with the management of the media and LBA (e.g., error correcting codes, etc.).

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

In some embodiments, the memory subsystem 110 includes a media mapper 113 that can adjust the mapping of LBAs to the corresponding physical addresses in a sparse manner, such as via a sparse addressing scheme of the physical addresses or a non-sequential mapping of logical addresses to physical addresses. The sparsity interleaves unprovisioned capacity with provisioned capacity to reduce proximity disturb within the provisioned capacity. In some embodiments, the controller 115 includes at least a portion of the media mapper 113. For example, the controller 115 can include a processor 117 (processing device) configured to execute instructions stored in local memory 119 for performing the operations described herein. In some embodiments, the media mapper 113 is part of the host system 120, an application, or an operating system. Further details with regards to the operations of the media mapper 113 are described below.

In some embodiments, the memory subsystem 110 includes a disturb tracker 114 that can track whether locations within provisioned space contain data for preservation. If a location within the provisioned capacity does not include written data, the memory subsystem 110 ignores disturbs to that location and thereby avoids the overhead associated with remediation. In some embodiments, the controller 115 includes at least a portion of the disturb tracker 114. For example, the controller 115 can include a processor 117 (processing device) configured to execute instructions stored in local memory 119 for performing the operations described herein. In some embodiments, the disturb tracker 113 is part of the host system 120, an application, or an operating system. Further details with regards to the operations of the disturb tracker 114 are described below.

FIGS. 2A-2B illustrate exemplary sparse provisioning of media using a sparse addressing scheme in accordance with some embodiments of the present disclosure. In these illustrations, a simple grid of squares represents the total number of sectors of media 112, which generally correspond to the smallest amount of data that the host system 120 can read from or write to the media during normal operation. As indicated, typical sector sizes are 512 or 4,096 bytes. As a result, a sector identifies a group of memory cells that provide sufficient storage for an LBA, plus any additional control data such as error correcting codes. Since sectors are accessed as a unit, the memory subsystem 110 can manage disturb at the sector-level. The numbers within the squares represent the media address of the sector. As illustrated in FIGS. 2A-2B, the media mapper 113 addresses the sectors from 0 to 31 using a sparse addressing scheme. As used herein, a sparse addressing scheme maps sequential addresses to non-adjacent physical locations or sectors within the media in at least one direction. In the illustrated embodiment, the media mapper 113 switches between addressing even-numbered rows (0, 2) and odd-numbered rows (1, 3) across the columns (0-7) before switching between the odd-numbered rows and even-numbered rows across the columns Note that a sector address may reference many underlying physical addresses within the media, such as the addresses of each page within a group of pages, where the group of pages provide the storage backing for the sector. The sparse addressing scheme may vary from one implementation to another, subject to the particular media architecture and LBA to media mapping, so long as the translation from an LBA to sector or physical media address can be performed algorithmically if avoiding logical-to-physical mapping tables is desired. By varying the addressing scheme, and thereby adjusting the sequencing of activating access lines that couple to individual memory cells, the media mapper 113 can address the media in a sparse manner. In the examples illustrated in FIGS. 2A and 2B, the media disturb profile aligns with the grid: a write to a sector aggresses or disturbs the contents of the victim sectors neighboring the aggressor to the north, south, east, and west. For example, a write to an aggressor in the middle of the media (e.g., the sector at address 20) would disturb four victims (e.g., the sectors at addresses 2, 4, 5, and 6), while corner and edge aggressors impact two or three victims, respectively.

In FIG. 2A, the host system 120 sends a command to the memory subsystem 110 to create a namespace "A" that includes 16 LBAs. In response, the memory subsystem 110 provisions 16 sectors within the media. The media mapper 113 employs the exemplary sparse addressing scheme described above. In this manner, the sectors provisioned for namespace A in the lower half of the address space (0-15, diagonal hatching) are interleaved with the unprovisioned sectors in the upper half of the address space (16-31, no hatching) in a "checkerboard" type manner. As a write to any of the provisioned sectors would only disturb sectors in unprovisioned capacity, the memory subsystem 110 avoids overhead associated with proximity disturb management.

In FIG. 2B, the host system 120 sends a command to the memory subsystem 110 to create a second namespace "B" that includes 8 LBAs. Again, the memory subsystem 110 provisions sectors within the media by creating a mapping of LBAs in namespace B to the 8 unprovisioned sectors at addresses 16-23 (shown using vertical hatching) using the same, sparse addressing scheme described above. Now, because writes to sectors at addresses 0-7 and 16-23 can disturb provisioned sectors, the memory subsystem 110 manages proximity in those regions but avoids overhead associated with disturb management in the address range of memory that remains sparse (e.g., addresses 10-15).

FIG. 3 illustrates another exemplary sparse provisioning of media using a sparse addressing scheme in accordance with some embodiments of the present disclosure. In this example, the media mapper 113 employs a sparse addressing scheme that arranges sectors in "bands" rather than the "checkerboard" illustrated in FIGS. 2A and 2B. Such a sparse addressing scheme may be used in media that exhibit a disturb profile that impacts neighbors along one axis and not along the other. For example, a write to the sector at address 16 would disturb the sectors at addresses 0 and 1 along the north-south axis (and not disturb the sector at address 18 along the east-west axis). As before, the host system 120 sends a command to the memory subsystem 110 to create a namespace "C" that includes 20 LBAs. The memory subsystem 110 provisions 20 sectors within the media by the media mapper 113 creating a mapping between the 20 LBAs in namespace "C" to the 20 unprovisioned sectors in media. Given the north-south disturb profile, the memory subsystem 110 manages proximity disturb for sectors 0-3 and 16-19 while avoiding management of proximity disturb for sectors 4-15.

FIG. 4 illustrates another exemplary sparse provisioning of media by adjusting a LBA to sector mapping rather than the addressing scheme used to address the sectors themselves. In this embodiment, the media sectors are addressed in one possible scan order (incrementing across the rows in a column before incrementing to the next column) The media mapper 113 performs the sparse provisioning at a higher logical LBA address space. In particular, the media mapper 113 creates a mapping of consecutive LBA addresses to non-consecutive physical addresses or sectors within the media. In the illustrated example, 50% of the sector address space is provisioned for a volume. As indicated by the formula within the media mapper 113, LBA-to-sector mapping places the provisioned capacity on even-valued sectors while odd-valued sectors provide disturb isolation. Thus, LBA 0 maps to sector address 0, LBA 1 maps to sector address 2, LBA 2 maps to sector address 4, and so on. As a result, the media mapper 113 creates a mapping of a 16-LBA namespace to the media in bands.

Figure 5:
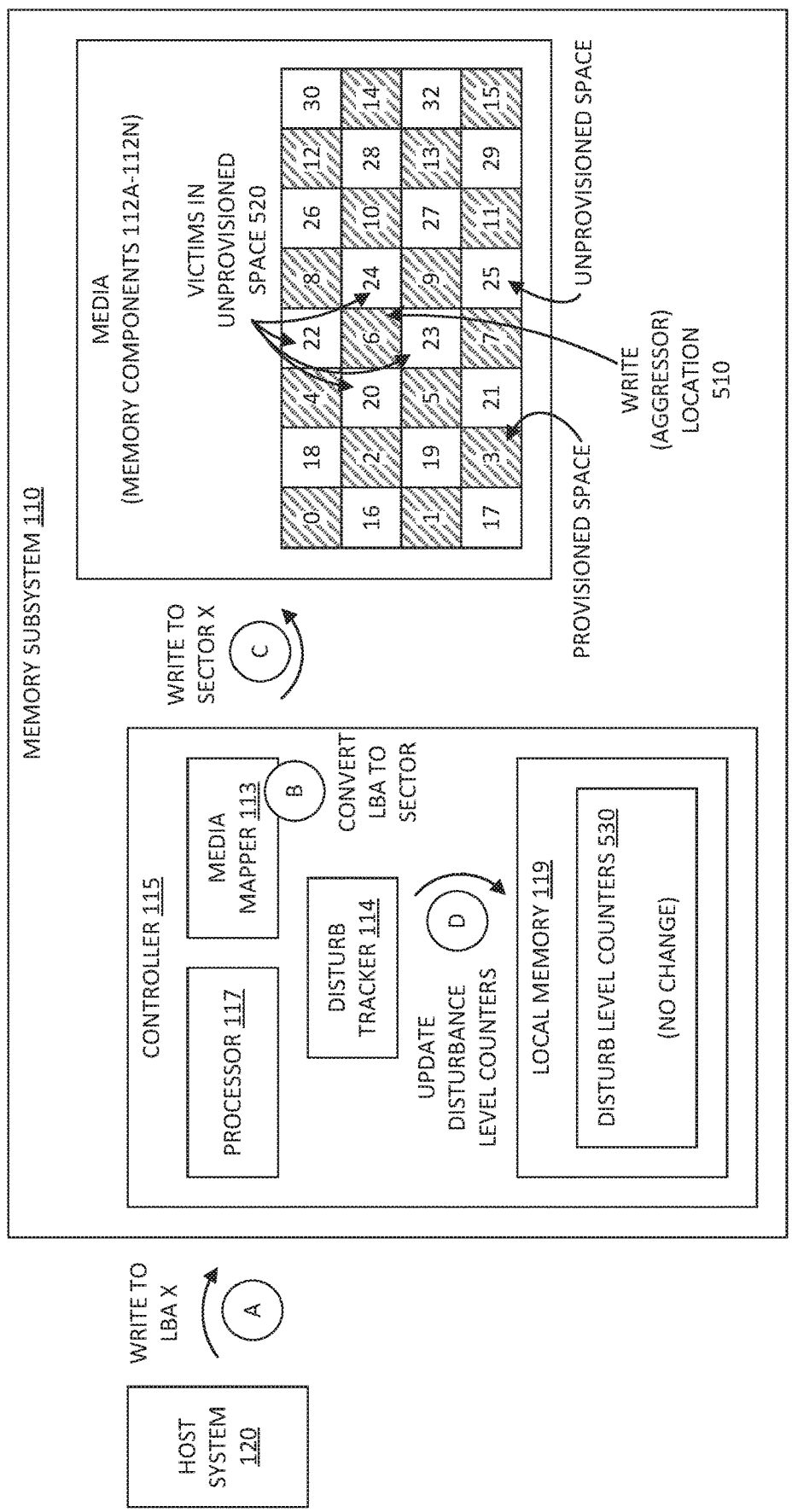
FIG. 5 illustrates disturb management in media with half or less than half of the total capacity of the media provisioned in accordance with some embodiments of the present disclosure.
Figure 6:
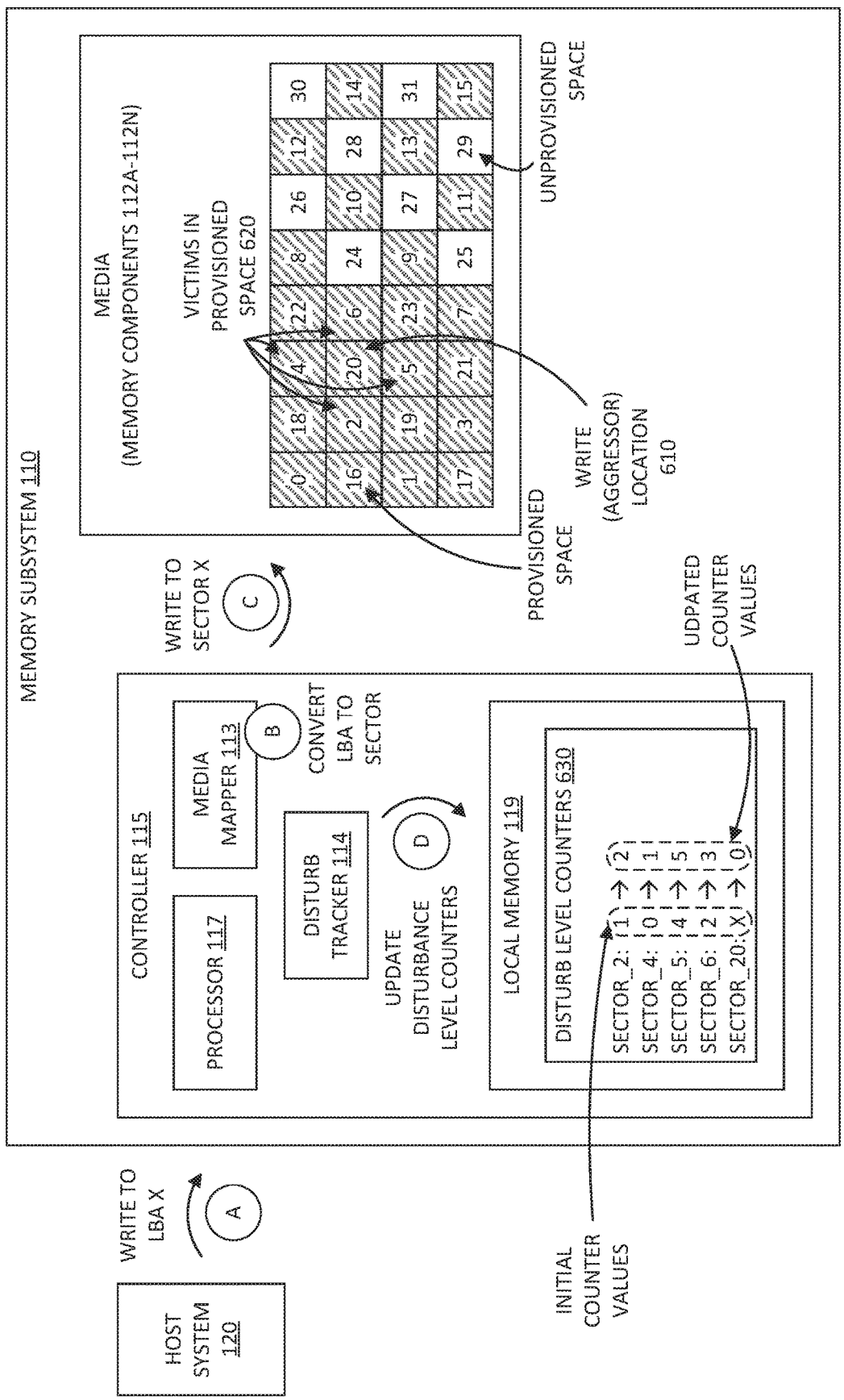
FIG. 6 illustrates disturb management in media with greater than half of the total capacity of the media provisioned in accordance with some embodiments of the present disclosure.

FIGS. 5 and 6 illustrate how the above sparse provisioning techniques eliminate proximity disturb management overhead for provisioning levels up to 50% of the media's capacity and incrementally increase the overhead as provisioning levels increase above 50%. FIG. 5 illustrates disturb management in media with half or less than half of the total capacity of the media provisioned in accordance with some embodiments of the present disclosure. As shown, 50% of the total media 112 is provisioned, as indicated by the hatched squares, with the balance remaining unprovisioned, as indicated by the squares without hatching. As indicated at the encircled letter "A," the host system 120 issues a write operation to the LBA X (where X is some address in the logical address space associated with a provisioned logical volume or namespace). At circle B, the media mapper 113 translates LBA X to a corresponding physical address, e.g., via a sparse addressing scheme as described above with reference to FIGS. 2 and 3. The controller 115 issues the write to the media, as indicated at circle C. In this example, the write location corresponds to an aggressor 510 at the sector at address 6, which disturbs any data stored in victims 520 at addresses 20, 22, 23, and 24. The controller 115 determines that the victims 520 are part of the unprovisioned space and thus avoids performing proximity disturb management. To make that determination, the controller 115 or disturb tracker 114 maintains a value representing the amount of provisioned capacity. If the amount of provisioned capacity is less than or equal to 50% of the overall capacity of the media and the provisioned capacity remains contiguous in the logical address space, the disturb tracker 114 avoids the overhead associated with accessing the local memory 119 to increment the disturb level counters 530. In this example, since the amount of provisioned capacity is 50%, the disturb tracker 114 does not update the disturb level counter 530 in the local memory 119 for any victim 520. Further, since the victims 520 are in unprovisioned space, they cannot aggress the provisioned space, so the disturb tracker 114 does not need to reset a disturb level counter associated with the aggressor 510, as indicated at circle D.

FIG. 6 illustrates disturb management in media with greater than half of the total capacity of the media provisioned in accordance with some embodiments of the present disclosure. As shown, 75% of the total media 112 is provisioned, as indicated by the hatched squares, with the balance remaining unprovisioned, as indicated by the squares without hatching. The controller 115 or the disturb tracker 114 determines that proximity disturb occurs by checking whether the value representing the amount of provisioned capacity is greater than 50%. Once the provisioned capacity exceeds 50% of the total capacity of the media, a write may cause proximity disturb, depending on its location relative to the remaining unprovisioned capacity. In this example, there are two groups of addresses that can cause disturb: 0-9 and 16-23. The controller 115 or disturb tracker 114 performs operations to determine whether the aggressor address is within one of those groups, as described below.

In an exemplary embodiment, the controller 115 or disturb tracker 114 checks whether the aggressor address is within the upper group (e.g., addresses 16-23) by comparing the aggressor address against the maximum capacity (in sectors) of the media. If the aggressor address is greater than or equal to the first sector address of the upper half of the media's total sector address space (e.g., the exemplary group including addresses 16-23), the write disturbs other provisioned locations and requires management. The controller 115 or disturb tracker 114 checks whether the aggressor address is within the lower group (e.g., 0-9) by comparing the aggressor address to the number of provisioned sectors above the halfway mark of the media's total sector address space. If the aggressor address is less than that number, the write disturbs other provisioned locations and requires management. If the aggressor address does not satisfy either of these checks, the memory subsystem can avoid the overhead associated with disturb management, excepting implementation-specific boundary conditions (e.g., at address 9). The following examples of a write to an address within each group (addresses 20 and 2) are illustrative.

As illustrated in FIG. 6, the host system 120 issues a write operation to the LBA X (where X is some address in the logical address space associated with a provisioned logical volume or namespace), as indicated at circle A. At circle B, the media mapper 113 translates LBA X to a corresponding physical address, e.g., via a sparse addressing scheme as described above with reference to FIGS. 2 and 3. The controller 115 issues the write to the media, as indicated at circle C. In this example, the write location 610 corresponds to the sector at address 20, which disturbs any data stored in victims 620 at addresses 2, 4, 5, and 6.

In this example, since the aggressor address 20 is greater than the first sector address in the upper half of the media's total sector address space (16), the controller 115 or disturb tracker 114 determines that the write impacts other provisioned portions of the media. As indicated at circle D, the disturb tracker 114 identifies the victims and increments their associated disturb level counters 530 within the local memory 119. In addition, since a write to a sector resets the disturb level associated with that sector, the disturb tracker 114 resets the disturb level counter associated with the aggressor address 20 to zero. Under the illustrated addressing scheme, the victims at sectors 2, 4, 5, and 6 may be identified relative to the aggressor address (AA) as indicated in the table below.

| Victim | Location | Example AA 20 |
|---|---|---|
| Northern | AA % (MAX_SECTOR/2) | 20% (32/2) = Sector 4 |
| Southern | AA % (MAX_SECTOR/2) + 1 | 20% (32/2) + 1 = Sector 5 |
| Eastern | AA % (MAX_SECTOR/2) + (SECTORS_COL/2) | 20% (32/2) + (4/2) = Sector 6 |
| Western | AA % (MAX_SECTOR/2) − (SECTORS_COL/2) | 20% (32/2) − (4/2) = Sector 2 |

Note that MAX_SECTOR is the total number of sectors available on the media and SECTORS_COL is the number of sectors per column in a memory array of the media with an even number of sectors per column.

Note that while FIG. 6 illustrates the disturb level counters associated with the victims being incremented by one, the actual value added to the disturb level counter may be greater than one, and depend on the victim's relative location to the aggressor (e.g., a northern or southern victim might be incremented by 5, while an eastern or western victim is incremented by 2). The increment value and threshold that triggers remediation depend on the particulars of the media architecture, such as the degree to which memory cells can withstand proximity disturb from nearby memory cells.

In another write operation, the host system 120 issues a write to another LBA that translates to the sector at address 2, which is within the lower group of addresses that can cause disturb. Since the aggressor address (2) is less than the number of provisioned sectors above half of the media's total sector address space (8, from sectors 16-23), the write causes proximity disturb of any data stored in victims at addresses 16, 18, 19, and 20 (aggressor/victim relationships not shown). As a result, the disturb tracker 114 identifies the victims and increments their associated disturb level counters. Under the illustrated addressing scheme, the victims at sectors 16, 18, 19, and 20 may be identified relative to the aggressor address as indicated in the table below using the notation indicated above.

| Victim | Location | Example AA 2 |
|---|---|---|
| Northern | AA + (MAX_SECTOR/2) | 2 + (32/2) = Sector 18 |
| Southern | AA + (MAX_SECTOR/2) + 1 | 2 + (32/2) + 1 = Sector 19 |
| Eastern | AA + (MAX_SECTOR/2) + (SECTORS_COL/2) | 2 + (32/2) + (4/2) = Sector 20 |
| Western | AA + (MAX_SECTOR/2) − (SECTORS_COL/2) | 20 + (32/2) − (4/2) = Sector 16 |

The above techniques for determining whether a write disturbs provisioned space and the identity of any victims may vary based on the specifics of a given memory subsystem, such as the media architecture, LBA to physical block mapping scheme, and addressing scheme.

Figure 7:
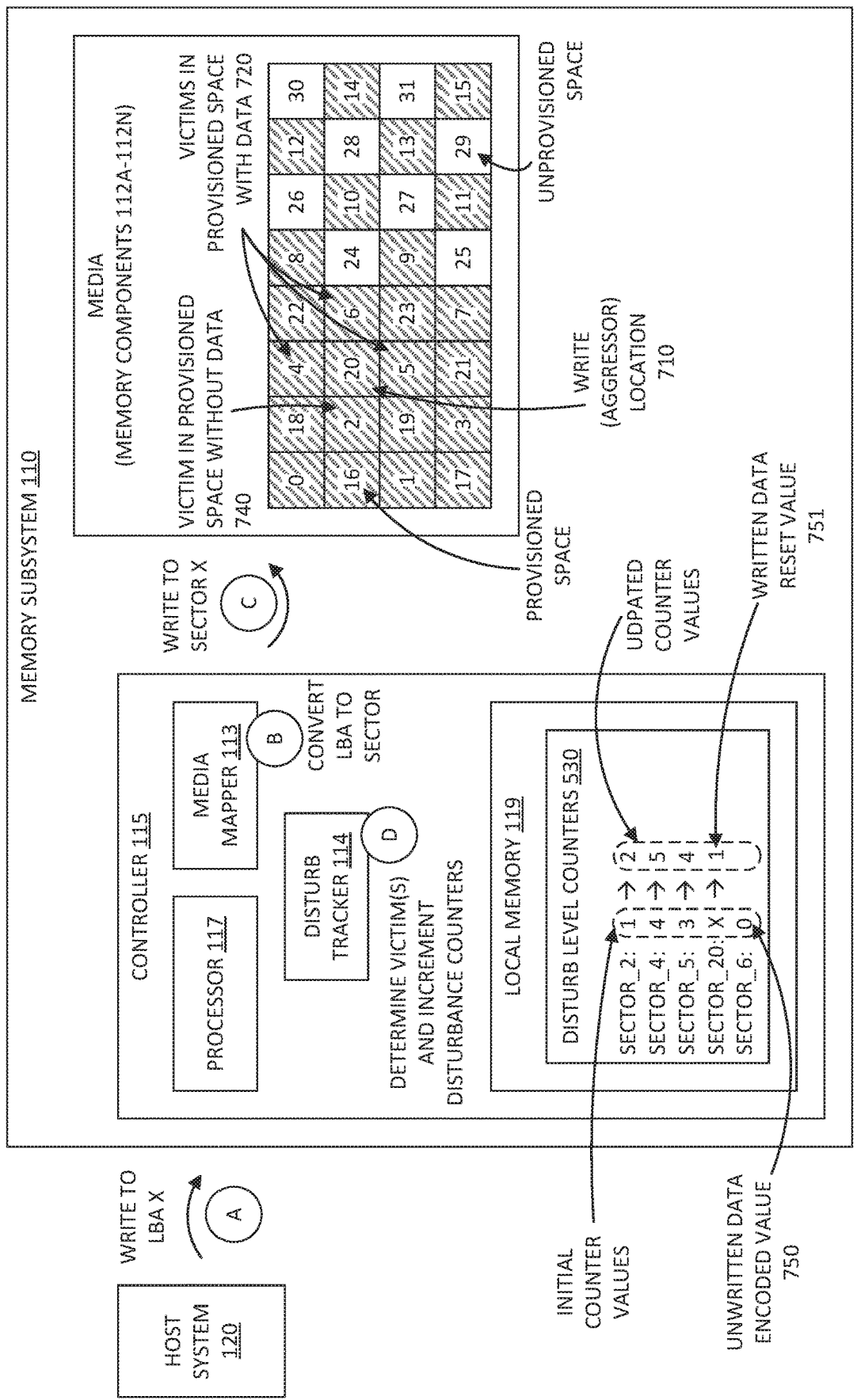
FIG. 7 illustrates disturb management in media with greater than half of the total capacity of the media provisioned and write tracking in accordance with some embodiments of the present disclosure.

FIG. 7 illustrates disturb management in media with greater than half of the total capacity of the media provisioned and write tracking in accordance with some embodiments of the present disclosure. In this example, the memory subsystem 110 employs an additional technique related to the disturb counter values that may be used in conjunction with or separately from the provisioning checks described above with reference to FIGS. 5 and 6. The technique involves the disturb tracker 114 placing disturbance level counters in a first state that indicates the specific sector has not been written and thus does not require disturb management and a second state once the specific sector has been written. If the disturb level counter value indicates the sector is not managed, the disturb tracker 114 avoids the need to track disturb levels and the overhead associated with remediation.

In an exemplary embodiment, the memory subsystem 110 resets all of the disturb level counters 630 to a value 750 indicating the corresponding sector does not need its disturb level managed (e.g., because no data has been written to the sector). In this example, a value of zero indicates that the sector's disturb level is unmanaged. When data is written to a sector, the disturb tracker 114 sets the associated disturb level counter to a value 751 indicating the corresponding sector is at a base level of disturb and is managed. Here, the value is one (not zero as illustrated in FIG. 6). When identifying victims, the disturb tracker 114 first checks whether the disturb level counter associated with a victim is non-zero. If so, it tracks disturb by incrementing the counters by the appropriate disturb amount for the disturb profile of the media. Otherwise, the disturb tracker 114 leaves the value of the disturb level counter associated with the sector in the unmanaged state, avoiding the remediation that would otherwise occur when if the disturb level counter exceeded the disturb threshold.

As indicated at circle A, the host system 120 issues a write operation to the LBA X (where X is some address in the logical address space associated with a provisioned logical volume or namespace). At circle B, the media mapper 113 translates LBA X to a corresponding physical address. The controller 115 issues the write to the media, as indicated at circle C. As indicated at circle D, the controller 115 or disturb tracker 114 determines that the write potentially causes a disturb and identifies the victims at addresses 2, 4, 5, and 6 (as described above with reference to FIG. 6). The disturb tracker 114 reads the values of the disturb level counters associated with the aggressor and victim addresses and updates the values as indicated. In particular, the value of the disturb level counter for sector 6 indicates that sector 6 is unmanaged (e.g., sector 6 has not been written or otherwise contains invalid data) while the other counters indicate the sectors are managed, so the disturb tracker 114 increments the disturb level counters of the managed victims (2, 4, and 5). Further, since sector 20 was written, the disturb tracker 114 sets the value of disturb level counter for sector address 20 to one, or another initial value for the disturb-managed state. Thus, until sector 6 contains data for preservation, disturbances to sector 6 will not result in remediation of sector 6 (the rewriting of which would disturb sectors 20, 22, 23, and 24).

Note that in some embodiments, the memory subsystem 110 may support a trim, unmap, or other command from the host system 120 that indicates the host system 120 no longer needs at least a portion of a logical volume. In doing so, the memory subsystem 110 can deprovision the sectors within the media that were mapped to the logical volume. As part of that process, the disturb tracker 114 can reset the disturb level counters corresponding to the deprovisioned sectors to the value indicating the sector's disturb level is unmanaged.

While write operations were generally described with reference to FIGS. 2A through 7, read operations can also cause proximity disturb and are similarly benefited from the sparse provisioning and/or write tracking described above.

Figure 8:
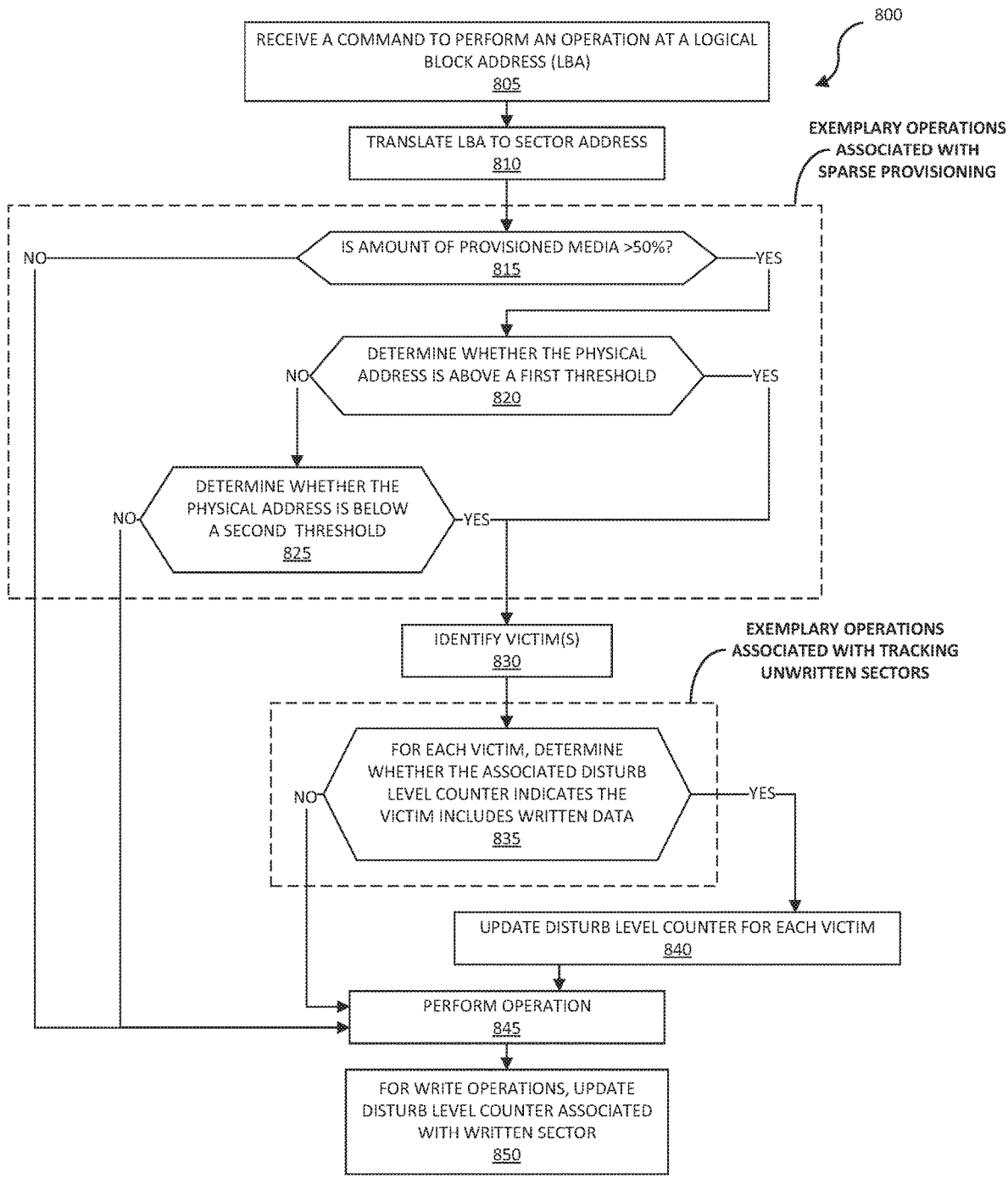
FIG. 8 is a flow diagram of an example method to manage proximity disturb in accordance with some embodiments of the present disclosure.

FIG. 8 is a flow diagram of an example method 800 to manage proximity disturb in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by one or more of the controller 115, media mapper 113, and disturb tracker 114 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As indicated by the dashed bounding boxes, blocks 815, 820, and 825 may be performed by embodiments of a memory subsystem that employ sparse provisioning, while block 835 may be performed by embodiments of a memory subsystem that employ disturb level counters that track whether the associated media location includes written data requiring proximity disturb management. Of course, some embodiments of a memory subsystem may employ both sparse provisioning and write tracking.

At block 805, the memory subsystem 110 receives a command from the host system 120 to perform an operation, such as a read or a write, at a logical block address. If the operation is a write operation, the host system 120 includes a payload of data to be written.

At block 810, the controller 115 or media mapper 113 translates the LBA to a physical address, such as the address of the sector that provides the physical storage for the LBA. To avoid maintaining a large logical-to-physical lookup table, some embodiments employ an algorithmic translation from LBAs to physical locations within the media, such as those described herein. For example, the translation may be based on a sparse addressing scheme (such as the one described above with reference to FIG. 2A) or based on another remapping (such as at the LBA level as described above with reference to FIG. 4).

In embodiments that do not employ sparse provisioning, the method 800 skips to block 830. Otherwise, the method 800 continues to block 815. At block 815, the controller 115 or disturb tracker 114 checks whether the amount provisioned media relative to the overall capacity of the media is greater than 50%. If the amount is 50% or below, such as the case illustrated in FIG. 5, the method 800 continues to block 845 to perform the commanded operation (from block 805) to the identified sector (from block 810). In such a case, the method 800 avoids managing the proximity disturb level of any victims because the unprovisioned capacity isolates sectors within the provisioned capacity to avoid proximity disturb. If the amount is above 50%, the method 800 continues to block 820.

At block 820, the controller 115 or disturb tracker 114 checks whether the sector address is above a first threshold. As described with reference to FIG. 6, the first threshold is the first sector address of the upper half of the media's total sector address space. This comparison determines whether the sector address corresponds to a region that does not include unprovisioned capacity as proximity disturb buffers due to its location within the upper half of the media's total capacity, such as sectors 16-23 in FIG. 6. If so, the method 800 continues to block 830. Otherwise, the method 800 continues to block 825.

At block 825, the controller 115 or disturb tracker 114 checks whether the sector address is below a second threshold. Again, as described with reference to FIG. 6, the second threshold is the number of provisioned sectors above the halfway mark of the media's total sector address space. This comparison determines whether the sector address corresponds to a region that does not include unprovisioned capacity as isolation (e.g., due to the sector's location within the lower half of the media's total capacity where the provisioned capacity exceeding 50% has consumed sectors, such as sectors 0-7 in FIG. 6). If the sector address is above the second threshold, such as a write to the sector at address 13 in FIG. 6, the method 800 continues to block 845 to write the payload to the identified sector without managing the proximity disturb level of any victims. If the sector address is below the second threshold, operations continue to block 830.

Reaching block 830 is indicative that the sparse provisioning was either not employed or unable to avoid proximity disturb associated with an access to the sector address associated with the LBA. As a result, the disturb tracker 114 identifies the victims associated with the write operation. Victim identification is contingent on the particular media architecture and mapping of LBAs to sectors. Exemplary techniques for identifying victims include those outlined in the tables introduce in the description of FIG. 6 (for sparse addressing schemes) or the one illustrated in FIG. 4 (for sparse mapping of LBAs to media). Other victim identification techniques are possible. Once the victims are identified, the method 800 skips to block 840 in embodiments that do not track whether a sector contains written data. Otherwise, the method 800 continues to block 835.

At block 835, the disturb tracker 114 determines whether the value of the disturb level counter for each identified victim indicates that the victim contains written data or is within the purview of proximity disturb management. For example, the disturb tracker 114 reads the disturb level counters associated with the identified victims from the local memory 119. Consistent with the above example, a value of zero indicates the victim sector is unmanaged while a non-zero value indicates the victim is managed. If any of the values indicate a victim is managed, the method 800 proceeds to block 840. Otherwise, the method 800 proceeds to block 845.

At block 840, the disturb tracker 114 increments the value associated with each victim. In embodiments that do not track written data, this means the disturb tracker 114 increments the value associated with each victim identified at block 830. In embodiments that do track written data, the disturb tracker 114 increments the value associated with each victim identified at block 835 that included a value indicating the victim included written data.

At block 845, the controller 115 performs the commanded operation, such as reading data from the sector address or writing the payload to the sector address. In the case of a write operation, at block 850, the disturb tracker 114 updates the disturb level counter associated with the written sector, again subject to whether the embodiment tracks written data (see, e.g., the handling of the aggressor location in FIGS. 6, 7).

Figure 9:
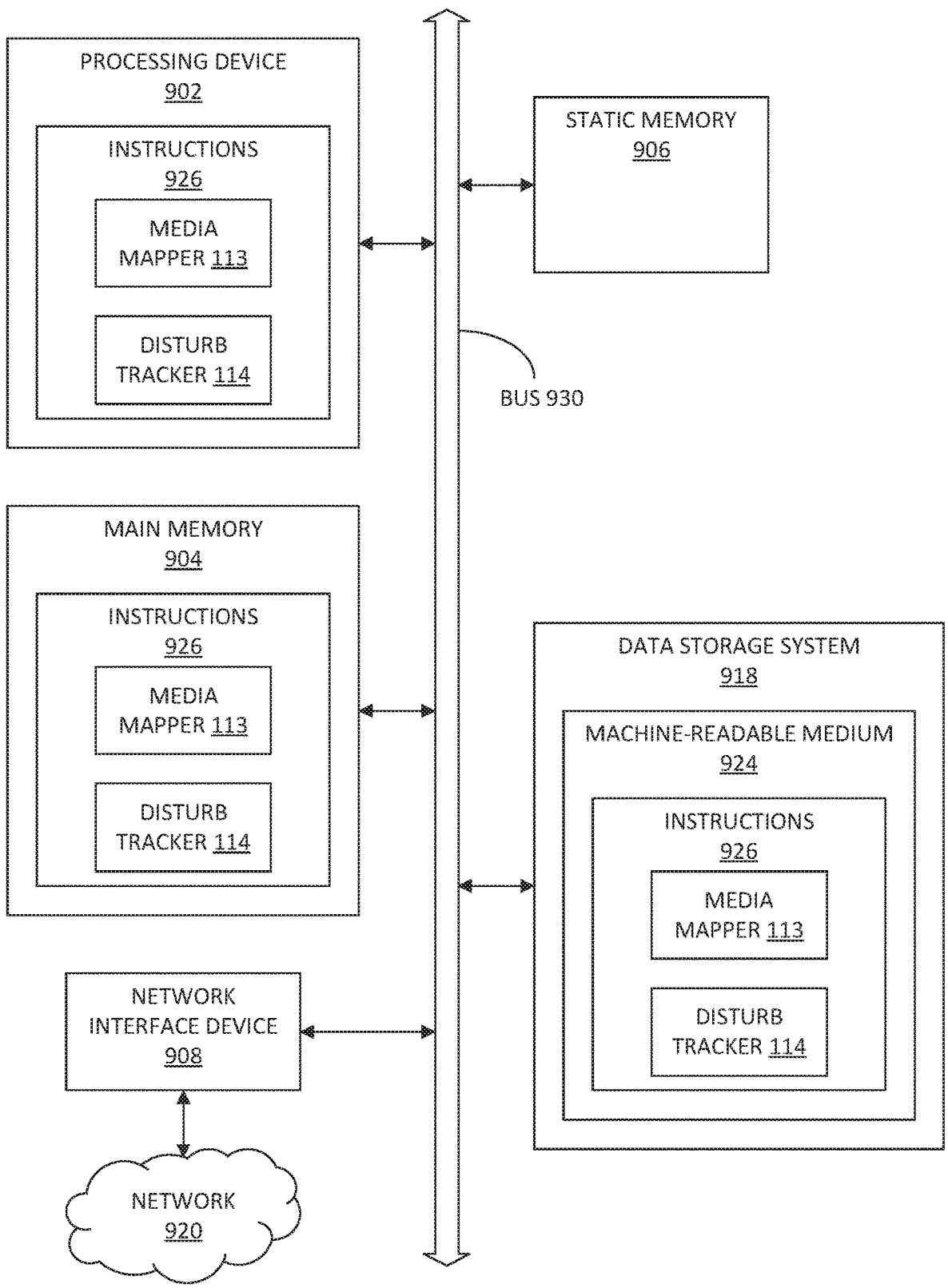
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the media mapper 113 or the disturb tracker 114 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory subsystem 110 of FIG. 1.

In one embodiment, the instructions 926 include instructions to implement functionality corresponding to a media mapper or disturb tracker (e.g., the media mapper 113 or the disturb tracker 114 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented method 800 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   provisioning a group of sectors of a memory for a logical volume such that an unprovisioned capacity of the memory interleaves at least a subset of the group of sectors to provide proximity disturb isolation;
   receiving a request to access the memory, the request including a logical address within the logical volume;
   identifying a sector within the provisioned group of sectors corresponding to the logical address;
   performing the requested access in the sector within the provisioned group of sectors; and
   determining whether to perform proximity disturb management by comparing a capacity of the provisioned group of sectors to a value related to a total capacity of the memory.

2. The method of claim 1, further comprising:
   determining that the requested access will disturb data stored on the memory based on the sector being outside of the subset of the group of sectors that has proximity disturb isolation;
   identifying a victim sector; and
   updating a value of a disturb level counter associated with the victim sector.

3. The method of claim 2, wherein the determining comprises comparing an address of the sector to a value related to a total number of sectors of the memory.

4. The method of claim 1, further comprising:
   identifying a victim sector; and
   incrementing a disturb level counter associated with the victim sector if a value of the disturb level counter indicates that the victim sector stores data.

5. The method of claim 4, further comprising updating a disturb level counter associated with the sector to indicate that the sector stores data.

6. The method of claim 1, wherein the provisioned group of sectors are addressed via an addressing scheme that maps sequential addresses to non-adjacent sectors within the memory in at least one direction.

7. The method of claim 1, wherein the provisioned group of sectors are identified via a mapping of non-consecutive logical addresses within the logical volume to a group of consecutive sector addresses within the memory.

8. A non-transitory computer-readable storage medium comprising instructions that, when executed by a processing device, cause the processing device to:
   provision a group of sectors of a memory for a logical volume such that an unprovisioned capacity of the memory interleaves at least a subset of the group of sectors to provide proximity disturb isolation;
   receive a request to access the memory, the request including a logical address within the logical volume;
   identify a sector within the provisioned group of sectors corresponding to the logical address; and
   perform the requested access in the sector within the provisioned group of sectors; and
   determining whether to perform proximity disturb management by comparing a capacity of the provisioned group of sectors to a value related to a total capacity of the memory.

9. The non-transitory computer-readable storage medium of claim 8, wherein the processing device is further to:
   determine that the requested access will disturb data stored on the memory based on the sector being outside of the subset of the group of sectors that has proximity disturb isolation;
   identify a victim sector; and
   update a value of a disturb level counter associated with the victim sector.

10. The non-transitory computer-readable storage medium of claim 9, wherein to determine whether the requested access will disturb data stored on the memory, the processing device is to compare an address of the sector to a value related to a total number of sectors of the memory.

11. The non-transitory computer-readable storage medium of claim 8, wherein the processing device is further to:
    identify a victim sector; and
    increment a disturb level counter associated with the victim sector if a value of the disturb level counter indicates that the victim sector stores data.

12. The non-transitory computer-readable storage medium of claim 11, wherein the processing device is further to update a disturb level counter associated with the sector to indicate that the sector stores data.

13. The non-transitory computer-readable storage medium of claim 8, wherein the provisioned group of sectors are addressed via an addressing scheme that maps sequential addresses to non-adjacent sectors within the memory in at least one direction.

14. The non-transitory computer-readable storage medium of claim 8, wherein the provisioned group of sectors are identified via a mapping of non-consecutive logical addresses within the logical volume to a group of consecutive sector addresses within the memory.

15. A system comprising:

a memory component; and a processing device, operatively coupled with the memory component, to:

provision a group of sectors of a memory for a logical volume such that an unprovisioned capacity of the memory interleaves at least a subset of the group of sectors to provide proximity disturb isolation;

receive a request to access the memory, the request including a logical address within the logical volume;

identify a sector within the provisioned group of sectors corresponding to the logical address; and perform the requested access in the sector within the provisioned group of sectors; and determining whether to perform proximity disturb management by comparing a capacity of the provisioned group of sectors to a value related to a total capacity of the memory.

16. The system of claim 15, wherein the processing device is further to:

determine that the requested access will disturb data stored on the memory based on the sector being outside of the subset of the group of sectors that has proximity disturb isolation;

identify a victim sector; and update a value of a disturb level counter associated with the victim sector.

17. The system of claim 16, wherein to determine whether the requested access will disturb data stored on the memory, the processing device is to compare an address of the sector to a value related to a total number of sectors of the memory.

18. The system of claim 15, wherein the processing device is further to:

identify a victim sector; and increment a disturb level counter associated with the victim sector if a value of the disturb level counter indicates that the victim sector stores data.

19. The system of claim 18, wherein the processing device is further to update a disturb level counter associated with the sector to indicate that the sector stores data.

20. The system of claim 15, wherein the provisioned group of sectors are addressed via an addressing scheme that maps sequential addresses to non-adjacent sectors within the memory in at least one direction.

* * * * *